US010305500B1

(12) United States Patent
Jung et al.

(10) Patent No.: US 10,305,500 B1
(45) Date of Patent: May 28, 2019

(54) AMPLIFICATION CIRCUIT, AND FREQUENCY DIVIDING CIRCUIT, SEMICONDUCTOR APPARATUS AND SEMICONDUCTOR SYSTEM INCLUDING THE AMPLIFICATION CIRCUIT AND OR FREQUENCY DIVIDING CIRCUIT

(71) Applicant: SK hynix Inc., Icheon-si, Gyeonggi-do (KR)

(72) Inventors: Hae Kang Jung, Gwangmyeong-si (KR); Sun Ki Cho, Suwon-si (KR); Yong Suk Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/038,835

(22) Filed: Jul. 18, 2018

(30) Foreign Application Priority Data

Dec. 21, 2017 (KR) .......................... 10-2017-0176621

(51) Int. Cl.
  *H03L 5/00* (2006.01)
  *H03L 7/18* (2006.01)
  *H03G 3/30* (2006.01)
  *H03F 3/213* (2006.01)

(52) U.S. Cl.
  CPC ............... *H03L 7/18* (2013.01); *H03F 3/213* (2013.01); *H03G 3/3078* (2013.01)

(58) Field of Classification Search
  CPC .......... H03L 7/18; H03F 3/213; H03G 3/3078

USPC .......... 327/117, 306, 333; 326/62–63, 80–82
See application file for complete search history.

(56) References Cited

U.S. PATENT DOCUMENTS

| | | | |
|---|---|---|---|
| 7,453,294 B1* | 11/2008 | Wang | H03K 3/012 327/117 |
| 8,324,939 B2 | 12/2012 | Wang | |
| 8,519,742 B2* | 8/2013 | Zhang | H03K 3/356121 326/46 |
| 8,570,085 B2* | 10/2013 | Veggetti | H03K 3/0375 327/202 |
| 8,970,272 B2* | 3/2015 | Zhang | H03K 3/017 327/203 |
| 9,166,571 B2* | 10/2015 | Connell | H03K 3/356104 |
| 2013/0249612 A1 | 9/2013 | Zerbe et al. | |

* cited by examiner

*Primary Examiner* — Dinh T Le
(74) *Attorney, Agent, or Firm* — William Park & Associates Ltd.

(57) ABSTRACT

An amplification circuit is provided. The amplification circuit may include an amplification stage configured to amplify a first signal and a second signal, and generate third and fourth signals while in a first operation period. The amplification circuit may include a latch stage configured to latch the third and fourth signals while in a in a second operation period. The amplification circuit may supply a low voltage to the amplification stage during the first operation period, the low voltage to the latch stage during the second operation period, a high voltage to the amplification stage during the first operation period, and the high voltage to the latch stage during the second operation period.

25 Claims, 9 Drawing Sheets

FIG.5
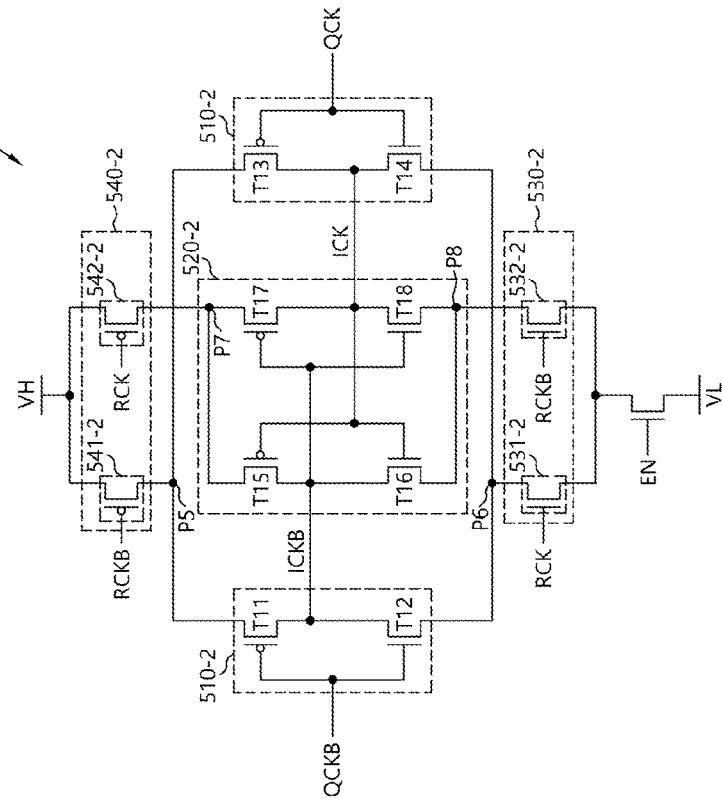
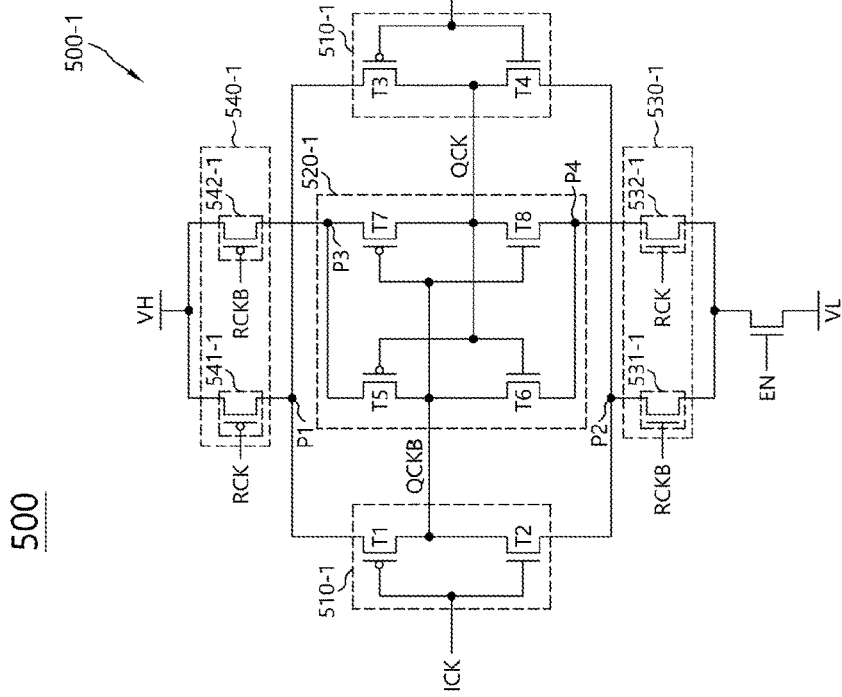

AMPLIFICATION CIRCUIT, AND FREQUENCY DIVIDING CIRCUIT, SEMICONDUCTOR APPARATUS AND SEMICONDUCTOR SYSTEM INCLUDING THE AMPLIFICATION CIRCUIT AND OR FREQUENCY DIVIDING CIRCUIT

CROSS-REFERENCES TO RELATED APPLICATION

The present application claims priority under 35 U.S.C. § 119(a) to Korean application number 10-2017-0176621, filed on Dec. 21, 2017, in the Korean Intellectual Property Office, which is incorporated herein by reference in its entirety.

BACKGROUND

1. Technical Field

Various embodiments generally relate to an integrated circuit technology, and, more particularly, to an amplification circuit, and a frequency dividing circuit, a semiconductor apparatus and a semiconductor system including the amplification circuit and or frequency diving circuit.

2. Related Art

Electronic apparatuses may include a large number of electronic components. Among the electronic apparatuses, a computer system may include many electronic components which are constructed by semiconductors. Semiconductor apparatuses which construct a computer system may transmit data in synchronization with a clock, and may perform serial communication. In order to quickly process a large amount of data in the semiconductor apparatuses, each of the semiconductor apparatuses receives data inputted in a serial type from another semiconductor apparatus, and converts the received data into data of a parallel type. Also, each of the semiconductor apparatuses may convert internal data of a parallel type into data of a serial type, and output the converted data to another semiconductor apparatus.

Each semiconductor apparatus may use a clock signal to align the data transmitted in a serial type through a bus. However, as the operating speed of a system gradually increases, the frequency of a clock signal is increased, and it is substantially difficult to precisely receive data by using a high frequency clock signal. Therefore, each semiconductor apparatus may include a frequency divider which is able to divide the frequency of a clock signal and generate multiphase clock signals. By amplifying and latching data through using the divided clock signals, it is possible to receive accurate data.

SUMMARY

In an embodiment, an amplification circuit may be provided. The amplification circuit may include an amplification stage configured to amplify a first signal and a second signal, and generate third and fourth signals. The amplification circuit may include a latch stage configured to latch the third and fourth signals. The amplification circuit may include a low voltage supplier configured to supply a low voltage to the amplification stage and the latch stage based on a reference clock signal. The amplification circuit may include a high voltage supplier configured to supply a high voltage to the amplification stage and the latch stage based on the reference clock signal.

In an embodiment, a frequency dividing circuit may be provided. The frequency dividing circuit may include a first amplification circuit including a first amplification stage which differentially amplifies a first signal and a second signal and generates a third signal and a fourth signal in a first operation period, and a first latch stage which latches the third signal and the fourth signal in a second operation period. The frequency dividing circuit may include a second amplification circuit including a second amplification stage which differentially amplifies the third signal and the fourth signal and generates the first signal and the second signal in the second operation period, and a second latch stage which latches the first signal and the second signal in the first operation period. A low voltage may be supplied to the first amplification stage and the second latch stage in the first operation period, and may be supplied to the first latch stage and the second amplification stage in the second operation period. A high voltage may be supplied to the first amplification stage and the second latch stage in the first operation period, and may be supplied to the first latch stage and the second amplification stage in the second operation period.

In an embodiment, a frequency dividing circuit may be provided. The frequency dividing circuit may include a first amplification circuit including a first amplification stage which differentially amplifies a first signal and a second signal and generates a third signal and a fourth signal in a first operation period, and a first latch stage which latches the third signal and the fourth signal in a second operation period. The frequency dividing circuit may include a second amplification circuit including a second amplification stage which differentially amplifies the third signal and the fourth signal and generates the first signal and the second signal in the second operation period, and a second latch stage which latches the first signal and the second signal in the first operation period. A low voltage may be supplied to the first amplification stage and the second latch stage in the first operation period, and may be supplied to the first latch stage and the second amplification stage in the second operation period. A high voltage may be supplied to the first amplification stage and the second latch stage in the first operation period, may be supplied to the first latch stage and the second amplification stage in the second operation period, and may be supplied to the first and second amplification stages in a high speed operation mode.

In an embodiment, an amplification circuit may be provided. The amplification circuit may include an amplification stage configured to amplify a first signal and a second signal, and generate third and fourth signals while in a first operation period. The amplification circuit may include a latch stage configured to latch the third and fourth signals while in a in a second operation period. The amplification circuit may supply a low voltage to the amplification stage during the first operation period, the low voltage to the latch stage during the second operation period, a high voltage to the amplification stage during the first operation period, and the high voltage to the latch stage during the second operation period.

BRIEF DESCRIPTION OF THE DRAWINGS

FIG. 5 is a diagram illustrating a representation of an example of the configuration of a frequency dividing circuit in accordance with an embodiment.

DETAILED DESCRIPTION

Hereinafter, an amplification circuit, and a frequency dividing circuit, a semiconductor apparatus and a semiconductor system the amplification circuit and or frequency diving circuit will be described below with reference to the accompanying drawings through various examples of embodiments.

Figure 1:
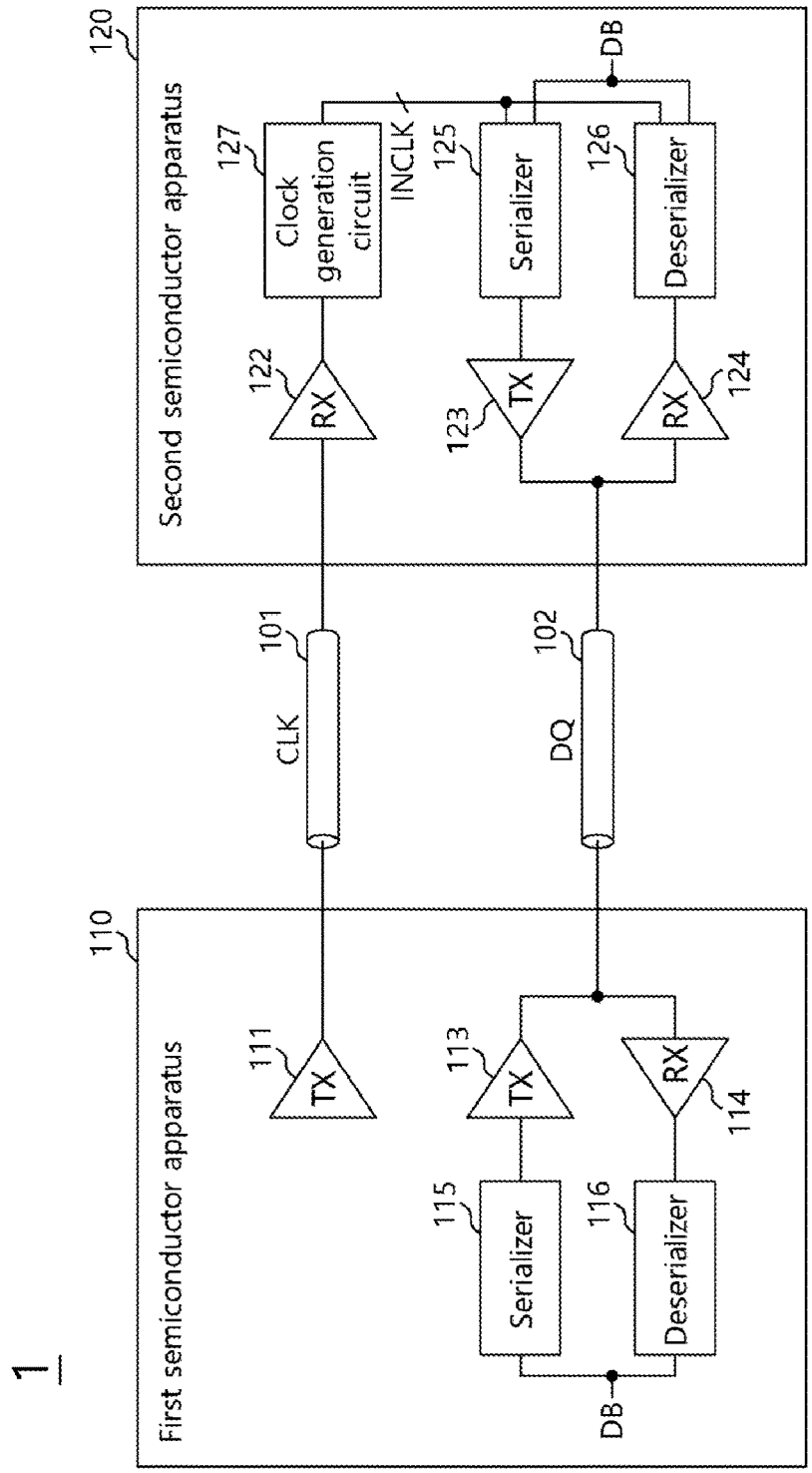
FIG. 1 is a diagram illustrating a representation of an example of the configuration of a semiconductor system in accordance with an embodiment.

FIG. 1 is a diagram illustrating a representation of an example of the configuration of a semiconductor system 1 in accordance with an embodiment. Referring to FIG. 1, the semiconductor system 1 may include a first semiconductor apparatus 110 and a second semiconductor apparatus 120. The first semiconductor apparatus 110 may provide various control signals which are necessary for the second semiconductor apparatus 120 to operate. The first semiconductor apparatus 110 may be a master apparatus for controlling the second semiconductor apparatus 120. For example, the first semiconductor apparatus 110 may be a host apparatus such as a central processing unit (CPU), a graphic processing unit (GPU), a multimedia processor (MMP), a digital signal processor, an application processor (AP) and a memory controller. The second semiconductor apparatus 120 may be a slave apparatus which performs various operations by being controlled by the first semiconductor apparatus 110. The second semiconductor apparatus 120 may be, for example, a memory apparatus, and the memory apparatus may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The second semiconductor apparatus 120 may be coupled with the first semiconductor apparatus 110 through a plurality of buses. The plurality of buses may be signal transmission paths, links or channels for transmitting signals. The plurality of buses may include a clock bus 101 and a data bus 102. The clock bus 101 may be a unidirectional bus, and the data bus 102 may be a bidirectional bus. The second semiconductor apparatus 120 may be coupled with the first semiconductor apparatus 110 through the clock bus 101 and receive a clock signal CLK through the clock bus 101. The clock signal CK may include one or more pairs of clock signals. The second semiconductor apparatus 120 may be coupled with the first semiconductor apparatus 110 through the data bus 102, and may receive data DQ from the first semiconductor apparatus 110 or transmit data DQ to the first semiconductor apparatus 110, through the data bus 102. While not shown, the semiconductor system 1 may further include a command bus and an address bus, and the second semiconductor apparatus 120 may be coupled with the first semiconductor apparatus 110 through the command bus and the address bus. The command bus and the address bus may be unidirectional buses. The first semiconductor apparatus 110 may transmit a command signal to the second semiconductor apparatus 120 through the command bus. The first semiconductor apparatus 110 may transmit an address signal to the second semiconductor apparatus 120 through the address bus.

The first semiconductor apparatus 110 may include a clock transmitter (TX) 111, a data transmitter (TX) 113, a data receiver (RX) 114, a serializer 115, and a deserializer 116. The clock transmitter 111 may be coupled with the clock bus 101, and may output the clock signal CLK generated in the first semiconductor apparatus 110, to the clock bus 101. The first semiconductor apparatus 110 may generate the clock signal CLK by including a clock generation circuit such as a phase-locked loop circuit (not shown). The first and second semiconductor apparatuses 110 and 120 may perform serial data communication. The serializer 115 may serialize internal data DB of the first semiconductor apparatus 110. The data transmitter 113 may output the serialized data through the data bus 102 as the data DQ. The data receiver 114 may receive the data DQ transmitted from the second semiconductor apparatus 120, through the data bus 102. The deserializer 116 may deserialize the data received through the data receiver 114, and may generate the internal data DB of the first semiconductor apparatus 110.

The second semiconductor apparatus 120 may include a clock receiver (RX) 122, a clock generation circuit 127, a data transmitter (TX) 123, a data receiver (RX) 124, a serializer 125 and a deserializer 126. The clock receiver 122 may be coupled with the clock bus 101, and may receive the clock signal CLK transmitted through the clock bus 101. The clock generation circuit 127 may receive the clock signal CLK through the clock receiver 122, and may generate a plurality of internal clock signals INCLK. The clock generation circuit 127 may divide the frequency of the clock signal CLK and generate the plurality of internal clock signals INCLK. In an embodiment, the plurality of internal clock signals INCLK may have a frequency lower than the clock signal CLK. For example, the frequency of the clock signal CLK may be two times the frequency of the plurality of internal clock signals INCLK.

The second semiconductor apparatus 120 may receive the data DQ transmitted from the first semiconductor apparatus 110 or transmit the data DQ to the first semiconductor apparatus 110, in synchronization with the clock signal CLK. The second semiconductor apparatus 120 may receive and/or sample the data DQ transmitted through the data bus 102, in synchronization with the clock signal CLK. In order to sufficiently secure a timing margin for receiving and/or sampling the data DQ, the second semiconductor apparatus 120 may use the internal clock signal INCLK which is generated by dividing the clock signal CLK. Similarly, the second semiconductor apparatus 120 may output the data DQ to the first semiconductor apparatus 110 in synchronization with the clock signal CLK. In order to sufficiently secure a timing margin for outputting the data DQ, the second semiconductor apparatus 120 may use the internal clock signal INCLK which is generated by dividing the clock signal CLK. The serializer 125 may serialize internal data DB of the second semiconductor apparatus 120. The serializer 125 may serialize the internal data DB of the second semiconductor apparatus 120 in synchronization with the internal clock signal INCLK. The data transmitter 123 may output the serialized data through the data bus 102 as the data DQ. The data receiver 124 may receive the data DQ transmitted from the first semiconductor apparatus 110, through the data bus 102. The deserializer 126 may deserialize the data received through the data receiver 124. The deserializer 126 may deserialize the data received through the data receiver 124, in synchronization with the internal clock signal INCLK, and may generate the internal data DB of the second semiconductor apparatus 120.

Figure 2:
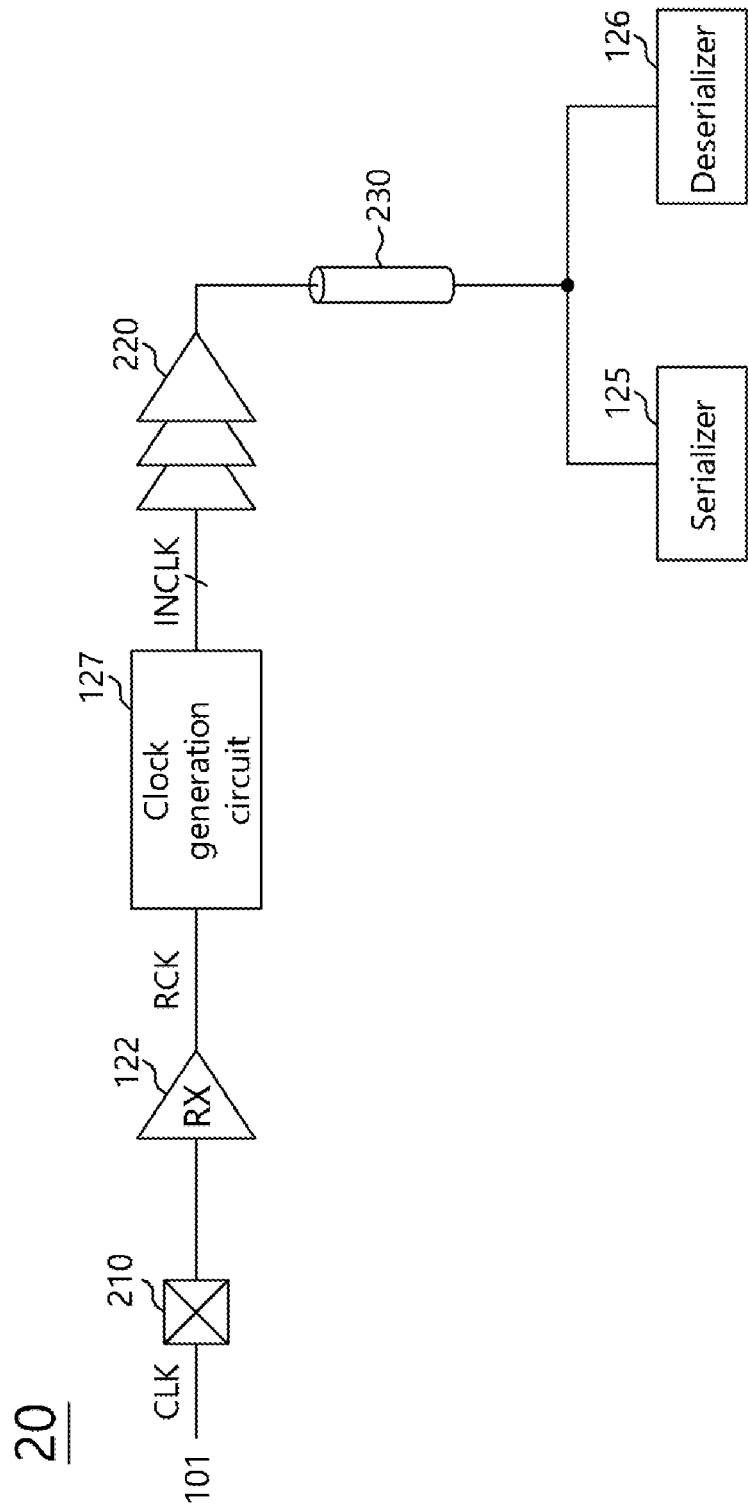
FIG. 2 is a diagram illustrating a representation of an example of a clock path in accordance with an embodiment.

FIG. 2 is a diagram illustrating a representation of an example of a clock path 20 in accordance with an embodiment. Referring to FIG. 1 together, the second semiconductor apparatus 120 may be coupled with the clock bus 101 through a clock pad 210. The clock receiver 122 may receive the clock signal CLK through the clock pad 210 and generate a reference clock signal RCK. The clock generation circuit 127 may divide the frequency of the reference clock signal RCK and generate the plurality of internal clock signals INCLK. The clock generation circuit 127 may include a frequency dividing circuit which divides the frequency of the reference clock signal RCK and generates the plurality of internal clock signals INCLK. The plurality of internal clock signals INCLK may be buffered through a buffer 220, and the buffered internal clock signals INCLK may be transmitted to an internal circuit of the second semiconductor apparatus 120 through an internal clock bus 230. The serializer 125 and the deserializer 126 may be coupled with the internal clock bus 230, and may receive the internal clock signals INCLK transmitted through the internal clock bus 230. As shown in FIG. 2, the clock signal CLK received by the second semiconductor apparatus 120 may be provided to the serializer 125 and the deserializer 126 via various components and through a substantially long path. Therefore, a delay time cannot help but occur in the clock path 20. The second semiconductor apparatus 120 prescribes a latency as a delay time for a data input/output operation. The latency may define a delay time from a point of time when the second semiconductor apparatus 120 starts a data input/output operation based on a command signal to a point of time when data DQ is actually received/transmitted through the data bus 102. Since the latency may be associated with the operating speed of a semiconductor apparatus, minimizing a delay time likely to occur in the clock path 20 may improve the operating speed of the second semiconductor apparatus 120. The clock generation circuit 127 may be generally constructed by a frequency divider and a buffer. A semiconductor apparatus in accordance with an embodiment may include an improved frequency dividing circuit, thereby minimizing a delay time likely to occur in the clock path 20.

Figure 3:
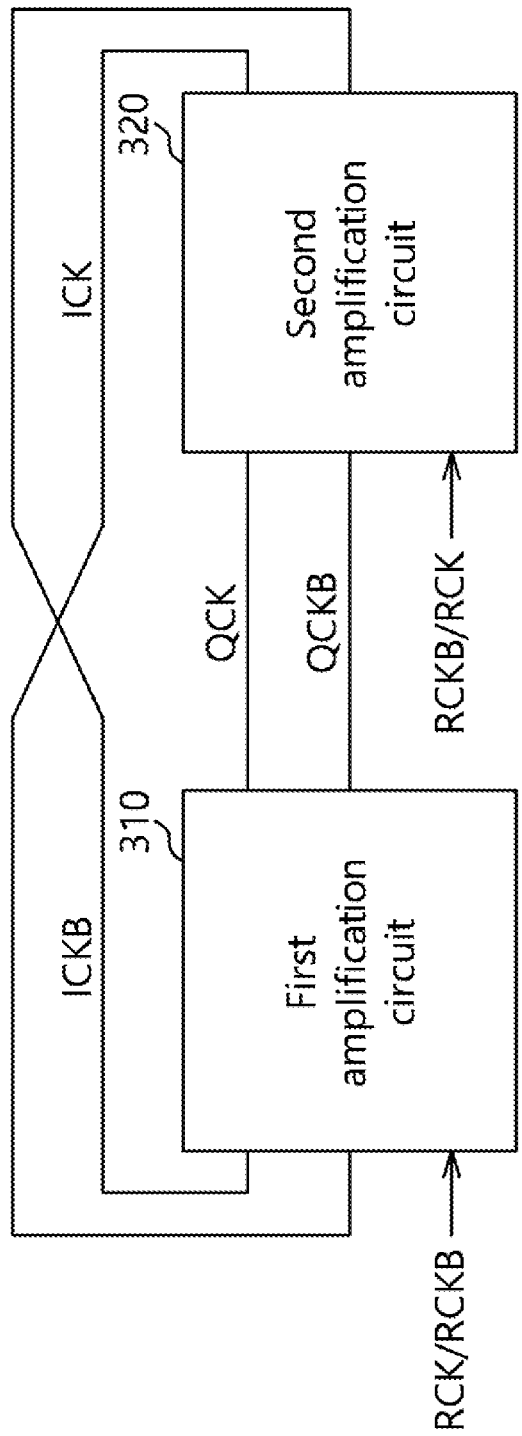
FIG. 3 is a diagram illustrating a representation of an example of the configuration of a frequency dividing circuit in accordance with an embodiment.

FIG. 3 is a diagram illustrating a representation of an example of the configuration of a frequency dividing circuit 300 in accordance with an embodiment. In FIG. 3, the frequency dividing circuit 300 may include a first amplification circuit 310 and a second amplification circuit 320. The first and second amplification circuits 310 and 320 may receive a reference clock signal RCK and a complementary reference clock signal RCKB. The first and second amplification circuits 310 and 320 may respectively operate in synchronization with the reference clock signal RCK and the complementary reference clock signal RCKB. The first amplification circuit 310 may receive a first signal ICK and a second signal ICKB, and may output a third signal QCK and a fourth signal QCKB. The first amplification circuit 310 may generate the third signal QCK and the fourth signal QCKB by differentially amplifying the first signal ICK and the second signal ICKB, and may latch the third signal QCK and the fourth signal QCKB. For example, the first amplification circuit 310 may generate the third and fourth signals QCK and QCKB by differentially amplifying the first and second signals ICK and ICKB in a first operation period. The first amplification circuit 310 may latch the third and fourth signals QCK and QCKB in a second operation period. The first and second operation periods might not overlap with each other. The first and second operation periods may be determined based on the level of the reference clock signal RCK. For example, the first operation period may be the first level period of the reference clock signal RCK, and the first level may be a logic low level. The second operation period may be the second level period of the reference clock signal RCK, and the second level may be a logic high level. The first amplification circuit 310 may generate the third and fourth signals QCK and QCKB by differentially amplifying the first and second signals ICK and ICKB in the first level period of the reference clock signal RCK, and may latch the third and fourth signals QCK and QCKB in the second level period of the reference clock signal RCK.

The second amplification circuit 320 may receive the third signal QCK and the fourth signal QCKB, and may output the first signal ICK and the second signal ICKB. The second amplification circuit 320 may generate the first and second signals ICK and ICKB by differentially amplifying the third and fourth signals QCK and QCKB, and may latch the first and second signals ICK and ICKB. For example, the second amplification circuit 320 may generate the first and second signals ICK and ICKB by differentially amplifying the third and fourth signals QCK and QCKB in the second operation period. The second amplification circuit 320 may latch the first and second signals ICK and ICKB in the first operation period. The second amplification circuit 320 may generate the first and second signals ICK and ICKB by differentially amplifying the third and fourth signals QCK and QCKB in the second level period of the reference clock signal RCK, and may latch the first and second signals ICK and ICKB in the first level period of the reference clock signal RCK.

The first to fourth signals ICK, ICKB, QCK and QCKB may be provided as the internal clock signals INCLK, respectively, shown in FIGS. 1 and 2. The first signal ICK may be provided as a first internal clock signal. The second signal ICKB may be provided as a second internal clock signal, and may have a phase difference of 180 degrees with respect to the first internal clock signal. The third signal QCK may be provided as a third internal clock signal, and may have a phase difference of 90 degrees with respect to the first internal clock signal. The fourth signal QCKB may be provided as a fourth internal clock signal, and may have a phase difference of 180 degrees with respect to the third internal clock signal and a phase difference of 270 degrees with respect to the first internal clock signal. The first and second amplification circuits 310 and 320 may form a chain structure in which the input and output terminals thereof are coupled with each other, and thereby, may successively generate the first to fourth signals ICK, ICKB, QCK and QCKB which toggle with a frequency two times lower than and/or a cycle two times longer than the reference clock signal RCK, while the reference clock signal RCK is inputted.

Figure 4:
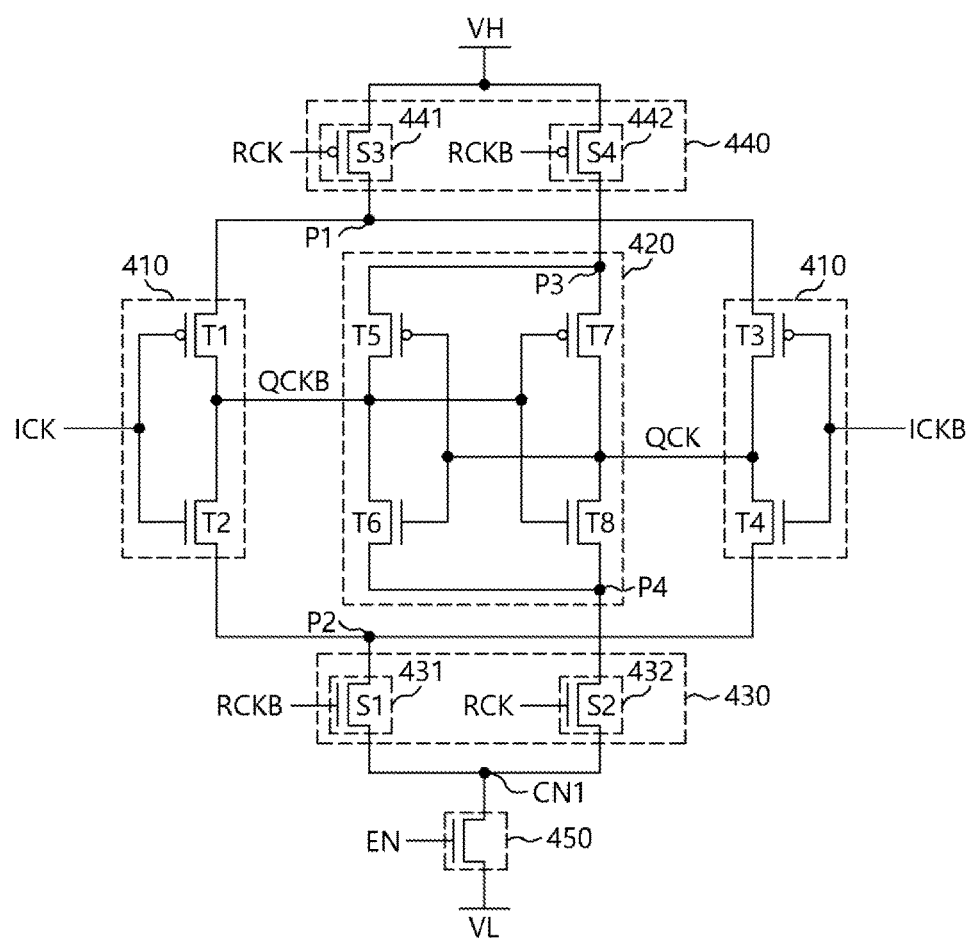
FIG. 4 is a diagram illustrating a representation of an example of the configuration of an amplification circuit in accordance with an embodiment.

FIG. 4 is a diagram illustrating a representation of an example of the configuration of an amplification circuit 400 in accordance with an embodiment. The amplification circuit 400 shown in FIG. 4 may be applied as the first amplification circuit 310 shown in FIG. 3. The amplification circuit 400 may receive first and second signals ICK and ICKB and output third and fourth signals QCK and QCKB. The amplification circuit 400 may generate the third and fourth signals QCK and QCKB by amplifying the first and second signals ICK and ICKB in a first operation period, and may latch the third and fourth signals QCK and QCKB in a second operation period. The amplification circuit 400 may generate the third and fourth signals QCK and QCKB by amplifying the first and second signals ICK and ICKB and latch the third and fourth signals QCK and QCKB, based on a reference clock signal RCK. The amplification circuit 400 may generate the third and fourth signals QCK and QCKB by amplifying the first and second signals ICK and ICKB in the first level period of the reference clock signal RCK, and may latch the third and fourth signals QCK and QCKB in the second level period of the reference clock signal RCK.

In FIG. 4, the amplification circuit 400 may include an amplification stage 410, a latch stage 420, a low voltage supplier 430 and a high voltage supplier 440. The amplification stage 410 may amplify the first and second signals ICK and ICKB and generate the third and fourth signals QCK and QCKB. The latch stage 420 may latch the third and fourth signals QCK and QCKB. The amplification stage 410 may be activated in the first operation period, and the latch stage 420 may be activated in the second operation period. The amplification stage 410 may amplify the first and second signals ICK and ICKB and generate the third and fourth signals QCK and QCKB in the first operation period and/or the first level period of the reference clock signal RCK. The latch stage 420 may latch the third and fourth signals QCK and QCKB in the second operation period and/or the second level period of the reference clock signal RCK.

The low voltage supplier 430 may supply a low voltage VL to the amplification stage 410 and the latch stage 420 based on the reference clock signal RCK. The low voltage VL may be a power supply voltage of the amplification circuit 400. For example, the low voltage VL may be a ground voltage. The low voltage supplier 430 may supply the low voltage VL to the amplification stage 410 and thereby activate the amplification stage 410, in the first operation period. The low voltage supplier 430 may supply the low voltage VL to the latch stage 420 and thereby activate the latch stage 420, in the second operation period. The low voltage supplier 430 may supply the low voltage VL to one of the amplification stage 410 and the latch stage 420 based on the reference clock signal RCK. The low voltage supplier 430 may supply the low voltage VL to the amplification stage 410 in the first level period of the reference clock signal RCK, and may supply the low voltage VL to the latch stage 420 in the second level period of the reference clock signal RCK.

The low voltage supplier 430 may include a first low voltage switch 431 and a second low voltage switch 432. The first low voltage switch 431 may supply the low voltage VL to the amplification stage 410 based on the reference clock signal RCK. The first low voltage switch 431 may supply the low voltage VL to the amplification stage 410 in the first level period of the reference clock signal RCK. The second low voltage switch 432 may supply the low voltage VL to the latch stage 420 based on the reference clock signal RCK. The second low voltage switch 432 may supply the low voltage VL to the latch stage 420 in the second level period of the reference clock signal RCK.

The high voltage supplier 440 may supply a high voltage VH to the amplification stage 410 and the latch stage 420 based on the reference clock signal RCK. The high voltage VH may be a power supply voltage of the amplification circuit 400. For example, the high voltage VH may have a level higher than the low voltage VL. The high voltage supplier 440 may supply the high voltage VH to the amplification stage 410 and thereby activate the amplification stage 410, in the first operation period. The high voltage supplier 440 may supply the high voltage VH to the latch stage 420 and thereby activate the latch stage 420, in the second operation period. The high voltage supplier 440 may supply the high voltage VH to one of the amplification stage 410 and the latch stage 420 based on the reference clock signal RCK. The high voltage supplier 440 may supply the high voltage VH to the amplification stage 410 in the first level period of the reference clock signal RCK, and may supply the high voltage VH to the latch stage 420 in the second level period of the reference clock signal RCK.

The high voltage supplier 440 may include a first high voltage switch 441 and a second high voltage switch 442. The first high voltage switch 441 may supply the high voltage VH to the amplification stage 410 based on the reference clock signal RCK. The first high voltage switch 441 may supply the high voltage VH to the amplification stage 410 in the first level period of the reference clock signal RCK. The second high voltage switch 442 may supply the high voltage VH to the latch stage 420 based on the reference clock signal RCK. The second high voltage switch 442 may supply the high voltage VH to the latch stage 420 in the second level period of the reference clock signal RCK.

The amplification circuit 400 may further include an enable switch 450. The enable switch 450 may supply the low voltage VL to the low voltage supplier 430 based on an enable signal EN. The enable signal EN may be received to activate the amplification circuit 400, and may be a bias voltage which has a level sufficient to turn on the enable switch 450.

The amplification stage 410 may include a first transistor T1, a second transistor T2, a third transistor T3 and a fourth transistor T4. The first and third transistors T1 and T3 may be P-channel MOS transistors, and the second and fourth transistors T2 and T4 may be N-channel MOS transistors. The first transistor T1 may have a gate which receives the first signal ICK and a source which is coupled with a first power node P1. The first power node P1 may be coupled with the first high voltage switch 441 of the high voltage supplier 440. The second transistor T2 may have a gate which receives the first signal ICK, a drain which is coupled with the drain of the first transistor T1 and a source which is coupled with a second power node P2. The second power node P2 may be coupled with the first low voltage switch 431 of the low voltage supplier 430. The fourth signal QCKB may be outputted from the drains of the first and second transistors T1 and T2. The third transistor T3 may have a gate which receives the second signal ICKB and a source which is coupled with the first power node P1. The fourth transistor T4 may have a gate which receives the second signal ICKB, a drain which is coupled with the drain of the third transistor T3 and a source which is coupled with the second power node P2. The third signal QCK may be outputted from the drains of the third and fourth transistors T3 and T4.

The latch stage 420 may include a fifth transistor T5, a sixth transistor T6, a seventh transistor T7 and an eighth transistor T8. The fifth and seventh transistors T5 and T7 may be P-channel MOS transistors, and the sixth and eighth transistors T6 and T8 may be N-channel MOS transistors. The fifth transistor T5 may have a gate which is coupled with the drains of the third and fourth transistors T3 and T4 and receives the third signal QCK. The fifth transistor T5 may have a source which is coupled with a third power node P3. The third power node P3 may be coupled with the second high voltage switch 442 of the high voltage supplier 440. The sixth transistor T6 may have a gate which receives the third signal QCK, a drain which is coupled in common with the drains of the first transistor T1, the second transistor T2 and the fifth transistor T5 and a source which is coupled with a fourth power node P4. The fourth power node P4 may be coupled with the second low voltage switch 432 of the low voltage supplier 430. The seventh transistor T7 may have a gate which is coupled with the drains of the first and second transistors T1 and T2 and receives the fourth signal QCKB. The seventh transistor T7 may have a source which is coupled with the third power node P3. The eighth transistor T8 may have a gate which receives the fourth signal QCKB, a drain which is coupled in common with the drains of the third transistor T3, the fourth transistor T4 and the seventh transistor T7 and a source which is coupled with the fourth power node P4.

The first low voltage switch 431 may include a first switch transistor S1, and the second low voltage switch 432 may include a second switch transistor S2. The first and second switch transistors S1 and S2 may be N-channel MOS transistors. The first switch transistor S1 may have a gate which receives a complementary reference clock signal RCKB, a drain which is coupled with the second power node P2 and a source which is coupled with a common node CN1. The common node CN1 may be coupled with the terminal of the low voltage VL through the enable switch 450. The second switch transistor S2 may have a gate which receives the reference clock signal RCK, a drain which is coupled with the fourth power node P4 and a source which is coupled with the common node CN1.

The first high voltage switch 441 may include a third switch transistor S3, and the second high voltage switch 442 may include a fourth switch transistor S4. The third and fourth switch transistors S3 and S4 may be P-channel MOS transistors. The third switch transistor S3 may have a gate which receives the reference clock signal RCK, a source which is coupled with the terminal of the high voltage VH and a drain which is coupled with the first power node P1. The fourth switch transistor S4 may have a gate which receives the complementary reference clock signal RCKB, a source which is coupled with the terminal of the high voltage VH and a drain which is coupled with the third power node P3.

In the first operation period, the first high voltage switch 441 and the first low voltage switch 431 may be turned on based on the reference clock signal RCK and the complementary reference clock signal RCKB, and the amplification stage 410 may be supplied with the high voltage VH through the first power node P1 and be supplied with the low voltage VL through the second power node P2. Thus, the amplification stage 410 may differentially amplify the first and second signals ICK and ICKB and generate the third and fourth signals QCK and QCKB. At this time, since the second high voltage switch 442 and the second low voltage switch 432 are turned off, the high voltage VH and the low voltage VL might not be supplied to the latch stage 420. That is to say, the third and fourth power nodes P3 and P4 may be floated. Therefore, even though the voltage levels of the third and fourth signals QCK and QCKB are changed based on the first and second signals ICK and ICKB, the latch stage 420 may consume no current. In the second operation period, the second high voltage switch 442 and the second low voltage switch 432 may be turned on based on the complementary reference clock signal RCKB and the reference clock signal RCK, and the latch stage 420 may be supplied with the high voltage VH through the third power node P3 and be supplied with the low voltage VL through the fourth power node P4. Thus, the latch stage 420 may latch the third and fourth signals QCK and QCKB and may hold the levels of the third and fourth signals QCK and QCKB. At this time, since the first high voltage switch 441 and the first low voltage switch 431 are turned off, the high voltage VH and the low voltage VL might not be supplied to the amplification stage 410. That is to say, the first and second power nodes P1 and P2 may be floated. Therefore, the amplification stage 410 may consume no current.

FIG. 5 is a diagram illustrating a representation of an example of the configuration of a frequency dividing circuit 500 in accordance with an embodiment. In FIG. 5, the frequency dividing circuit 500 may include a first amplification circuit 500-1 and a second amplification circuit 500-2. The first amplification circuit 500-1 and the second amplification circuit 500-2 may be substantially the same as the amplification circuit 400 shown in FIG. 4, and repeated descriptions may be omitted. The first amplification circuit 500-1 may include a first amplification stage 510-1 and a first latch stage 520-1. The first amplification stage 510-1 may include first to fourth transistors T1, T2, T3 and T4, and may generate third and fourth signals QCK and QCKB by differentially amplifying first and second signals ICK and ICKB. The first latch stage 520-1 may include fifth to eighth transistors T5, T6, T7 and T8, and may latch the third and fourth signals QCK and QCKB. The second amplification circuit 500-2 may have a configuration similar to the first amplification circuit 500-1 with only differences in the coupling relationships of input signals, output signals and reference clock signals. The second amplification circuit 500-2 may include a second amplification stage 510-2 and a second latch stage 520-2. The second amplification stage 510-2 may receive the third and fourth signals QCK and QCKB, and may output the first and second signals ICK and ICKB.

The second amplification stage 510-2 may include a first transistor T11, a second transistor T12, a third transistor T13 and a fourth transistor T14. The first and third transistors T11 and T13 may be P-channel MOS transistors, and the second and fourth transistors T12 and T14 may be N-channel MOS transistors. The first transistor T11 may have a gate which receives the fourth signal QCKB and a source which is coupled with a fifth power node P5. The second transistor T12 may have a gate which receives the fourth signal QCKB, a drain which is coupled with the drain of the first transistor T11 and a source which is coupled with a sixth power node P6. The second signal ICKB may be outputted from the drains of the first and second transistors T11 and T12. The third transistor T13 may have a gate which receives the third signal QCK and a source which is coupled with the fifth power node P5. The fourth transistor T14 may have a gate which receives the third signal QCK, a drain which is coupled with the drain of the third transistor T13 and a source which is coupled with the sixth power node P6. The first signal ICK may be outputted from the drains of the third and fourth transistors T13 and T14.

The second latch stage 520-2 may include a fifth transistor T15, a sixth transistor T16, a seventh transistor T17 and an eighth transistor T18. The fifth and seventh transistors T15 and T17 may be P-channel MOS transistors, and the sixth and eighth transistors T16 and T18 may be N-channel MOS transistors. The fifth transistor T15 may have a gate which is coupled with the drains of the third and fourth transistors T13 and T14 and receives the first signal ICK. The fifth transistor T15 may have a source which is coupled with a seventh power node P7. The sixth transistor T16 may have a gate which receives the first signal ICK, a drain which is coupled in common with the drains of the first transistor T11, the second transistor T12 and the fifth transistor T15 and a source which is coupled with an eighth power node P8. The seventh transistor T17 may have a gate which is coupled with the drains of the first and second transistors T11 and T12 and receives the second signal ICKB. The seventh transistor T17 may have a source which is coupled with the seventh power node P7. The eighth transistor T18 may have a gate which receives the second signal ICKB, a drain which is coupled in common with the drains of the third transistor T13, the fourth transistor T14 and the seventh transistor T17 and a source which is coupled with the eighth power node P8.

The frequency dividing circuit 500 may include a low voltage supply circuit 530-1 and 530-2 and a high voltage supply circuit 540-1 and 540-2. The low voltage supply circuit 530-1 and 530-2 may supply a low voltage VL to the first amplification stage 510-1 and the second latch stage 520-2 in a first operation period. The low voltage supply circuit 530-1 and 530-2 may supply the low voltage VL to the first latch stage 520-1 and the second amplification stage 510-2 in a second operation period. The high voltage supply circuit 540-1 and 540-2 may supply a high voltage VH to the first amplification stage 510-1 and the second latch stage 520-2 in the first operation period. The high voltage supply circuit 540-1 and 540-2 may supply the high voltage VH to the first latch stage 520-1 and the second amplification stage 510-2 in the second operation period.

The low voltage supply circuit 530-1 and 530-2 may include a first low voltage supplier 530-1 and a second low voltage supplier 530-2. The first low voltage supplier 530-1 may supply the low voltage VL to one of the first amplification stage 510-1 and the first latch stage 520-1 based on a reference clock signal RCK. The first low voltage supplier 530-1 may include a first low voltage switch 531-1 and a second low voltage switch 532-1. The first low voltage switch 531-1 may supply the low voltage VL to a second power node P2 in the first level period of the reference clock signal RCK. The second low voltage switch 532-1 may supply the low voltage VL to a fourth power node P4 in the second level period of the reference clock signal RCK. The first low voltage supplier 530-1 may be a component of the first amplification circuit 500-1. The second low voltage supplier 530-2 may supply the low voltage VL to one of the second amplification stage 510-2 and the second latch stage 520-2 based on the reference clock signal RCK. The second low voltage supplier 530-2 may include a third low voltage switch 531-2 and a fourth low voltage switch 532-2. The third low voltage switch 531-2 may supply the low voltage VL to the sixth power node P6 in the second level period of the reference clock signal RCK. The fourth low voltage switch 532-2 may supply the low voltage VL to the eighth power node P8 in the first level period of the reference clock signal RCK. The second low voltage supplier 530-2 may be a component of the second amplification circuit 500-2.

The high voltage supply circuit 540-1 and 540-2 may include a first high voltage supplier 540-1 and a second high voltage supplier 540-2. The first high voltage supplier 540-1 may supply the high voltage VH to one of the first amplification stage 510-1 and the first latch stage 520-1 based on the reference clock signal RCK. The first high voltage supplier 540-1 may include a first high voltage switch 541-1 and a second high voltage switch 542-1. The first high voltage switch 541-1 may supply the high voltage VH to a first power node P1 in the first level period of the reference clock signal RCK. The second high voltage switch 542-1 may supply the high voltage VH to a third power node P3 in the second level period of the reference clock signal RCK. The first high voltage supplier 540-1 may be a component of the first amplification circuit 500-1. The second high voltage supplier 540-2 may supply the high voltage VH to one of the second amplification stage 510-2 and the second latch stage 520-2 based on the reference clock signal RCK. The second high voltage supplier 540-2 may include a third high voltage switch 541-2 and a fourth high voltage switch 542-2. The third high voltage switch 541-2 may supply the high voltage VH to the fifth power node P5 in the second level period of the reference clock signal RCK. The fourth high voltage switch 542-2 may supply the high voltage VH to the seventh power node P7 in the first level period of the reference clock signal RCK. The second high voltage supplier 540-2 may be a component of the second amplification circuit 500-2.

Figure 6:
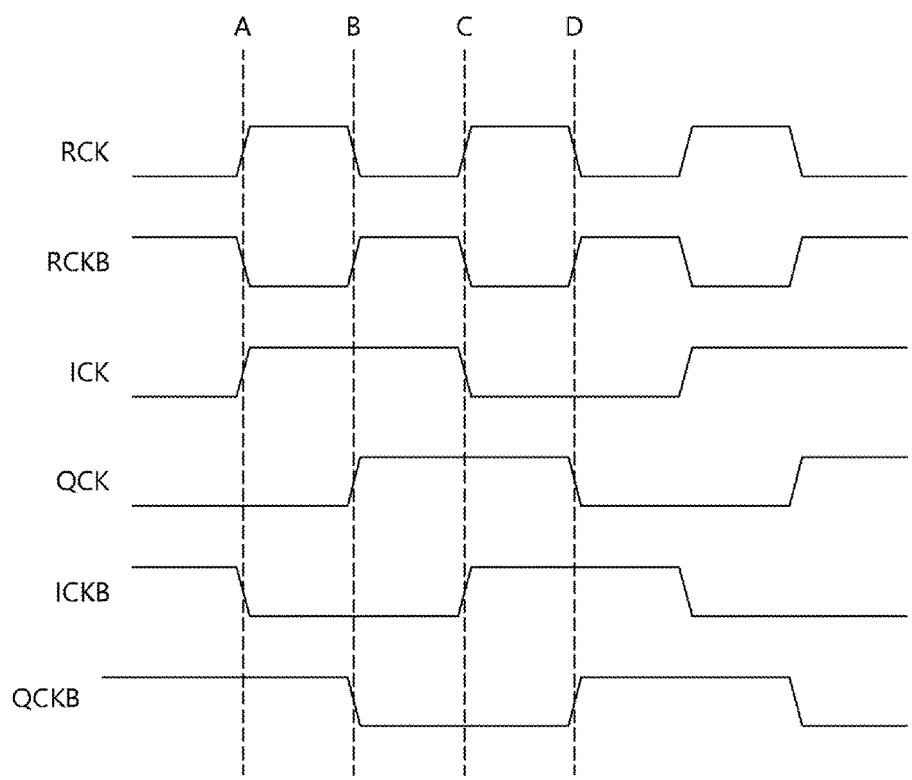
FIG. 6 is a representation of an example of a timing diagram to assist in the explanation of the operation of the frequency dividing circuit in accordance with an embodiment.

FIG. 6 is a representation of an example of a timing diagram to assist in the explanation of the operation of the frequency dividing circuit 500 in accordance with an embodiment. The operation of the frequency dividing circuit 500 in accordance with an embodiment will be described below with reference to FIGS. 5 and 6. For example, the initial states of the first and third signals ICK and QCK may be low levels, and the initial states of the second and fourth signals ICKB and QCKB may be high levels. If the reference clock signal RCK becomes a high level (A), a complementary reference clock signal RCKB may become a low level. When the reference clock signal RCK is the high level (A), the second low voltage switch 532-1 and the second high voltage switch 542-1 may be turned on, and the high voltage VH and the low voltage VL may be supplied to the first latch stage 520-1. The third low voltage switch 531-2 and the third high voltage switch 541-2 may be turned on, and the high voltage VH and the low voltage VL may be supplied to the second amplification stage 510-2. The fifth transistor T5 and the eighth transistor T8 of the first latch stage 520-1 may be turned on, and the first latch stage 520-1 may hold the third signal QCK at the low level and hold the fourth signal QCKB at the high level. Since the second amplification stage 510-2 receives the third signal QCK which has the low level and the fourth signal QCKB which has the high level, the second transistor T12 and the third transistor T13 may be turned on, and the second signal ICKB which has a low level and the first signal ICK which has a high level may be generated. At this time, the first low voltage switch 531-1, the first high voltage switch 541-1, the fourth low voltage switch 532-2 and the fourth high voltage switch 542-2 may be turned off, and the first amplification stage 510-1 and the second latch stage 520-2 might not be supplied with the high voltage VH and the low voltage VL. Therefore, a separate current consumption does not occur in the first amplification stage 510-1 and the second latch stage 520-2, and the voltage levels of the first to fourth signals ICK, ICKB, QCK and QCKB might not be changed by the first amplification stage 510-1 and the second latch stage 520-2.

If the reference clock signal RCK becomes a low level (B), the complementary reference clock signal RCKB may become a high level. When the reference clock signal RCK is the low level (B), the first low voltage switch 531-1 and the first high voltage switch 541-1 may be turned on, and the high voltage VH and the low voltage VL may be supplied to the first amplification stage 510-1. The fourth low voltage switch 532-2 and the fourth high voltage switch 542-2 may be turned on, and the high voltage VH and the low voltage VL may be supplied to the second latch stage 520-2. Since the first amplification stage 510-1 receives the first signal ICK which has the high level and the second signal ICKB which has the low level, the second transistor T2 and the third transistor T3 may be turned on, and the fourth signal QCKB which has a low level and the third signal QCK which has a high level may be generated. The sixth transistor T16 and the seventh transistor T17 of the second latch stage 520-2 may be turned on, and the second latch stage 520-2 may hold the first signal ICK at the high level and hold the second signal ICKB at the low level. At this time, the second low voltage switch 532-1, the second high voltage switch 542-1, the third low voltage switch 531-2 and the third high voltage switch 541-2 may be turned off, and the first latch stage 520-1 and the second amplification stage 510-2 might not be supplied with the high voltage VH and the low voltage VL. Therefore, a separate current consumption does not occur in the first latch stage 520-1 and the second amplification stage 510-2, and the voltage levels of the first to fourth signals ICK, ICKB, QCK and QCKB might not be changed by the first latch stage 520-1 and the second amplification stage 510-2.

When the reference clock signal RCK becomes the high level again (C), the complementary reference clock signal RCKB may become the low level. When the reference clock signal RCK is the high level (C), the second low voltage switch 532-1 and the second high voltage switch 542-1 may be turned on, and the high voltage VH and the low voltage VL may be supplied to the first latch stage 520-1. The third low voltage switch 531-2 and the third high voltage switch 541-2 may be turned on, and the high voltage VH and the low voltage VL may be supplied to the second amplification stage 510-2. The sixth transistor T6 and the seventh transistor T7 of the first latch stage 520-1 may be turned on, and the first latch stage 520-1 may hold the third signal QCK at the high level and hold the fourth signal QCKB at the low level. Since the second amplification stage 510-2 receives the third signal QCK which has the high level and the fourth signal QCKB which has the low level, the first transistor T11 and the fourth transistor T14 may be turned on, and the second signal ICKB which has the high level and the first signal ICK which has the low level may be generated. At this time, the first low voltage switch 531-1, the first high voltage switch 541-1, the fourth low voltage switch 532-2 and the fourth high voltage switch 542-2 may be turned off, and the first amplification stage 510-1 and the second latch stage 520-2 might not be supplied with the high voltage VH and the low voltage VL.

When the reference clock signal RCK becomes the low level again (D), the complementary reference clock signal RCKB may become the high level. When the reference clock signal RCK is the low level (D), the first low voltage switch 531-1 and the first high voltage switch 541-1 may be turned on, and the high voltage VH and the low voltage VL may be supplied to the first amplification stage 510-1. The fourth low voltage switch 532-2 and the fourth high voltage switch 542-2 may be turned on, and the high voltage VH and the low voltage VL may be supplied to the second latch stage 520-2. Since the first amplification stage 510-1 receives the first signal ICK which has the low level and the second signal ICKB which has the high level, the first transistor T1 and the fourth transistor T4 may be turned on, and the fourth signal QCKB which has the high level and the third signal QCK which has the low level may be generated. The fifth transistor T15 and the eighth transistor T18 of the second latch stage 520-2 may be turned on, and the second latch stage 520-2 may hold the first signal ICK at the low level and hold the second signal ICKB at the high level. At this time, the second low voltage switch 532-1, the second high voltage switch 542-1, the third low voltage switch 531-2 and the third high voltage switch 541-2 may be turned off, and the first latch stage 520-1 and the second amplification stage 510-2 might not be supplied with the high voltage VH and the low voltage VL. In this way, as the first level and second level periods of the reference clock signal RCK are repeated, the first to fourth signals ICK, ICKB, QCK and QCKB which have a phase difference of 90 degrees and have a frequency two times lower than the reference clock signal RCK may be generated.

Figure 7:
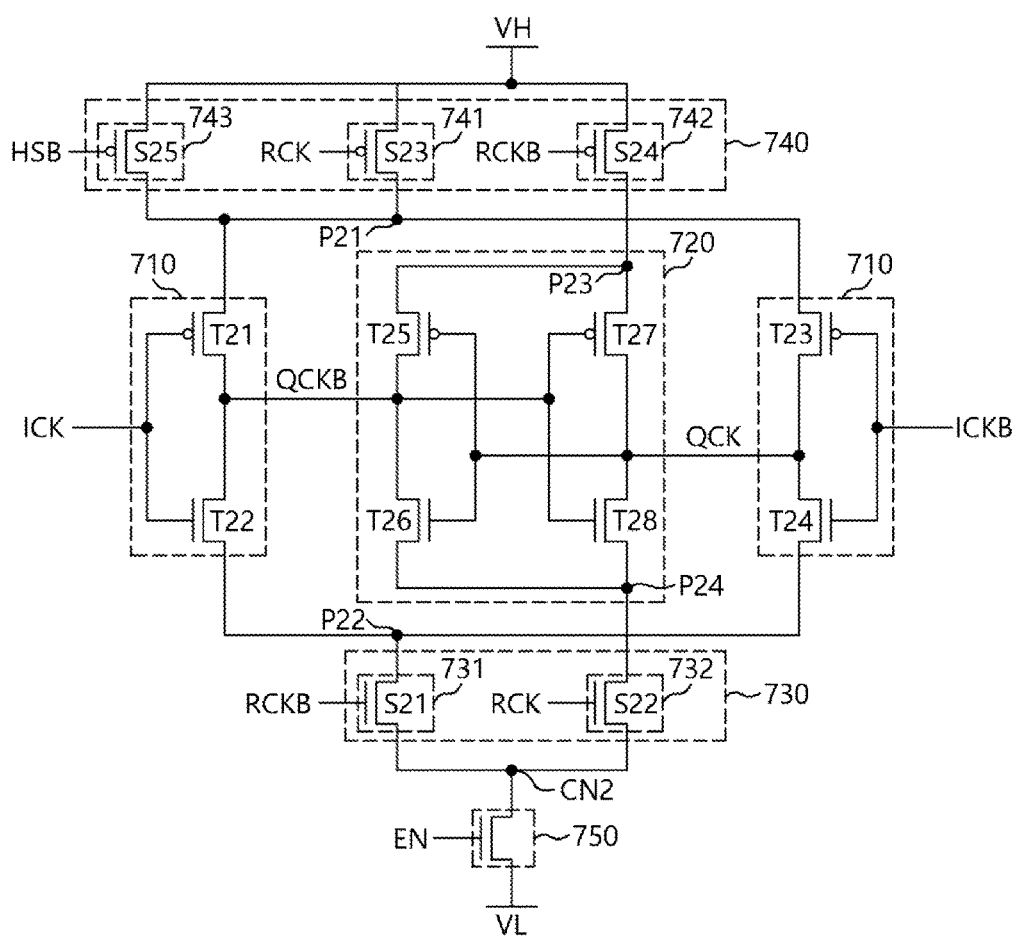
FIG. 7 is a diagram illustrating a representation of an example of the configuration of an amplification circuit in accordance with an embodiment.

FIG. 7 is a diagram illustrating a representation of an example of the configuration of an amplification circuit 700 in accordance with an embodiment. The amplification circuit 700 shown in FIG. 7 may be applied as the first amplification circuit 310 shown in FIG. 3. The amplification circuit 700 may receive first and second signals ICK and ICKB and output third and fourth signals QCK and QCKB. The amplification circuit 700 may generate the third and fourth signals QCK and QCKB by amplifying the first and second signals ICK and ICKB in a first operation period, and may latch the third and fourth signals QCK and QCKB in a second operation period. The amplification circuit 700 may generate the third and fourth signals QCK and QCKB by amplifying the first and second signals ICK and ICKB and latch the third and fourth signals QCK and QCKB, based on a reference clock signal RCK. The amplification circuit 700 may generate the third and fourth signals QCK and QCKB by amplifying the first and second signals ICK and ICKB in the first level period of the reference clock signal RCK, and may latch the third and fourth signals QCK and QCKB in the second level period of the reference clock signal RCK. Also, the amplification circuit 700 may perform an emphasis operation for the third and fourth signals QCK and QCKB when the third and fourth signals QCK and QCKB have low levels.

In FIG. 7, the amplification circuit 700 may include an amplification stage 710, a latch stage 720, a low voltage supplier 730 and a high voltage supplier 740. The amplification stage 710 may amplify the first and second signals ICK and ICKB and generate the third and fourth signals QCK and QCKB. The latch stage 720 may latch the third and fourth signals QCK and QCKB. The amplification stage 710 may amplify the first and second signals ICK and ICKB and generate the third and fourth signals QCK and QCKB in the first operation period and/or the first level period of the reference clock signal RCK. The latch stage 720 may latch the third and fourth signals QCK and QCKB in the second operation period and/or the second level period of the reference clock signal RCK.

The low voltage supplier 730 may supply a low voltage VL to the amplification stage 710 and the latch stage 720 based on the reference clock signal RCK. The low voltage supplier 730 may supply the low voltage VL to one of the amplification stage 710 and the latch stage 720 based on the reference clock signal RCK. The low voltage supplier 730 may supply the low voltage VL to the amplification stage 710 in the first level period of the reference clock signal RCK, and may supply the low voltage VL to the latch stage 720 in the second level period of the reference clock signal RCK.

The low voltage supplier 730 may include a first low voltage switch 731 and a second low voltage switch 732. The first low voltage switch 731 may supply the low voltage VL to the amplification stage 710 based on the reference clock signal RCK. The first low voltage switch 731 may supply the low voltage VL to the amplification stage 710 in the first level period of the reference clock signal RCK. The second low voltage switch 732 may supply the low voltage VL to the latch stage 720 based on the reference clock signal RCK. The second low voltage switch 732 may supply the low voltage VL to the latch stage 720 in the second level period of the reference clock signal RCK.

The high voltage supplier 740 may supply a high voltage VH to the amplification stage 710 and the latch stage 720 based on the reference clock signal RCK. The high voltage supplier 740 may supply the high voltage VH to one of the amplification stage 710 and the latch stage 720 based on the reference clock signal RCK. The high voltage supplier 740 may supply the high voltage VH to the amplification stage 710 in the first level period of the reference clock signal RCK, and may supply the high voltage VH to the latch stage 720 in the second level period of the reference clock signal RCK. The high voltage supplier 740 may supply the high voltage VH to the amplification stage 710 regardless of the reference clock signal RCK based on a high speed operation signal HSB. The high voltage supplier 740 may supply the high voltage VH to the amplification stage 710 regardless of the reference clock signal RCK when the high speed operation signal HSB is enabled. The high speed operation signal HSB may be enabled based on the operating speed of a semiconductor apparatus which may include the amplification circuit 700. The high speed operation signal HSB may be enabled in a high speed operation mode. For example, the high speed operation signal HSB may be enabled when the semiconductor apparatus operates at a high frequency, and may be disabled when the semiconductor apparatus operates at a frequency lower than the high frequency. The high voltage supplier 740 may supply the high voltage VH to the amplification stage 710 regardless of the reference clock signal RCK when the high speed operation signal HSB is enabled, and the amplification stage 710 may perform the emphasis operation for the third and fourth signals QCK and QCKB which have the low levels.

The high voltage supplier 740 may include a first high voltage switch 741, a second high voltage switch 742 and a third high voltage switch 743. The first high voltage switch 741 may supply the high voltage VH to the amplification stage 710 based on the reference clock signal RCK. The first high voltage switch 741 may supply the high voltage VH to the amplification stage 710 in the first level period of the reference clock signal RCK. The second high voltage switch 742 may supply the high voltage VH to the latch stage 720 based on the reference clock signal RCK. The second high voltage switch 742 may supply the high voltage VH to the latch stage 720 in the second level period of the reference clock signal RCK. The third high voltage switch 743 may supply the high voltage VH to the amplification stage 710 based on the high speed operation signal HSB. The third high voltage switch 743 may supply the high voltage VH to the amplification stage 710 when the high speed operation signal HSB is enabled.

The amplification circuit 700 may further include an enable switch 750. The enable switch 750 may supply the low voltage VL to the low voltage supplier 730 based on an enable signal EN. The enable signal EN may be received to activate the amplification circuit 700, and may be a bias voltage which has a level sufficient to turn on the enable switch 750.

The amplification stage 710 may include a first transistor T21, a second transistor T22, a third transistor T23 and a fourth transistor T24. The first and third transistors T21 and T23 may be P-channel MOS transistors, and the second and fourth transistors T22 and T24 may be N-channel MOS transistors. The first transistor T21 may have a gate which receives the first signal ICK and a source which is coupled with a first power node P21. The first power node P21 may be coupled with the first high voltage switch 740 and the third high voltage switch 743 of the high voltage supplier 741. The second transistor T22 may have a gate which receives the first signal ICK, a drain which is coupled with the drain of the first transistor T21 and a source which is coupled with a second power node P22. The second power node P22 may be coupled with the first low voltage switch 731 of the low voltage supplier 730. The fourth signal QCKB may be outputted from the drains of the first and second transistors T21 and T22. The third transistor T23 may have a gate which receives the second signal ICKB and a source which is coupled with the first power node P21. The fourth transistor T24 may have a gate which receives the second signal ICKB, a drain which is coupled with the drain of the third transistor T23 and a source which is coupled with the second power node P22. The third signal QCK may be outputted from the drains of the third and fourth transistors T23 and T24.

The latch stage 720 may include a fifth transistor T25, a sixth transistor T26, a seventh transistor T27 and an eighth transistor T28. The fifth and seventh transistors T25 and T27 may be P-channel MOS transistors, and the sixth and eighth transistors T26 and T28 may be N-channel MOS transistors. The fifth transistor T25 may have a gate which is coupled with the drains of the third and fourth transistors T23 and T24 and receives the third signal QCK. The fifth transistor T25 may have a source which is coupled with a third power node P23. The third power node P23 may be coupled with the second high voltage switch 742 of the high voltage supplier 740. The sixth transistor T26 may have a gate which receives the third signal QCK, a drain which is coupled in common with the drains of the first transistor T21, the second transistor T22 and the fifth transistor T25 and a source which is coupled with a fourth power node P24. The fourth power node P24 may be coupled with the second low voltage switch 732 of the low voltage supplier 730. The seventh transistor T27 may have a gate which is coupled with the drains of the first and second transistors T21 and T22 and receives the fourth signal QCKB. The seventh transistor T27 may have a source which is coupled with the third power node P23. The eighth transistor T28 may have a gate which receives the fourth signal QCKB, a drain which is coupled in common with the drains of the third transistor T23, the fourth transistor T24 and the seventh transistor T27 and a source which is coupled with the fourth power node P24.

The first low voltage switch 731 may include a first switch transistor S21, and the second low voltage switch 732 may include a second switch transistor S22. The first and second switch transistors S21 and S22 may be N-channel MOS transistors. The first switch transistor S21 may have a gate which receives a complementary reference clock signal RCKB, a drain which is coupled with the second power node P22 and a source which is coupled with a common node CN2. The common node CN2 may be coupled with the terminal of the low voltage VL through the enable switch 750. The second switch transistor S22 may have a gate which receives the reference clock signal RCK, a drain which is coupled with the fourth power node P24 and a source which is coupled with the common node CN2.

The first high voltage switch 741 may include a third switch transistor S23, the second high voltage switch 742 may include a fourth switch transistor S24, and the third high voltage switch 743 may include a fifth switch transistor S25. The third to fifth switch transistors S23, S24 and S25 may be P-channel MOS transistors. The third switch transistor S23 may have a gate which receives the reference clock signal RCK, a source which is coupled with the terminal of the high voltage VH and a drain which is coupled with the first power node P21. The fourth switch transistor S24 may have a gate which receives the complementary reference clock signal RCKB, a source which is coupled with the terminal of the high voltage VH and a drain which is coupled with the third power node P23. The fifth switch transistor S25 may have a gate which receives the high speed operation signal HSB, a source which is coupled with the terminal of the high voltage VH and a drain which is coupled with the first power node P21.

When the semiconductor apparatus operates at a low frequency, the high speed operation signal HSB may be disabled, and the third high voltage switch 743 may be turned off. In the first operation period, the first low voltage switch 731 and the first high voltage switch 741 may be turned on based on the reference clock signal RCK and the complementary reference clock signal RCKB, and the amplification stage 710 may be supplied with the low voltage VL and the high voltage VH. The amplification stage 710 may differentially amplify the first and second signals ICK and ICKB and generate the third and fourth signals QCK and QCKB. At this time, the second low voltage switch 732 and the second high voltage switch 742 may be turned off, and the latch stage 720 might not be supplied with the low voltage VL and the high voltage VH. Therefore, the latch stage 720 might not consume current by the third and fourth signals QCK and QCKB. In the second operation period, the second low voltage switch 732 and the second high voltage switch 742 may be turned on based on the reference clock signal RCK and the complementary reference clock signal RCKB, and the latch stage 720 may be supplied with the low voltage VL and the high voltage VH. The latch stage 720 may latch the third and fourth signals QCK and QCKB by holding the levels of the third and fourth signals QCK and QCKB. At this time, the first low voltage switch 731 and the first high voltage switch 741 may be turned off, and the amplification stage 710 might not be supplied with the low voltage VL and the high voltage VH. Therefore, the amplification stage 710 might not consume current by the first and second signals ICK and ICKB.

When the semiconductor apparatus operates at a high frequency, the high speed operation signal HSB may be enabled to a low level, and the third high voltage switch 743 may be turned on. In the first operation period, the amplification stage 710 may be supplied with the low voltage VL and the high voltage VH, and may differentially amplify the first and second signals ICK and ICKB and generate the third and fourth signals QCK and QCKB. At this time, the latch stage 720 might not be supplied with the low voltage VL and the high voltage VH, and no current may be consumed in the latch stage 720. In the second operation period, the latch stage 720 may be supplied with the low voltage VL and the high voltage VH, and may latch the third and fourth signals QCK and QCKB by holding the levels of the third and fourth signals QCK and QCKB. At this time, while the amplification stage 710 is not supplied with the low voltage VL, the amplification stage 710 may be supplied with the high voltage VH through the third high voltage switch 743. The amplification stage 710 may perform the emphasis operation for the third and fourth signals QCK and QCKB based on the first and second signals ICK and ICKB.

Figure 8:
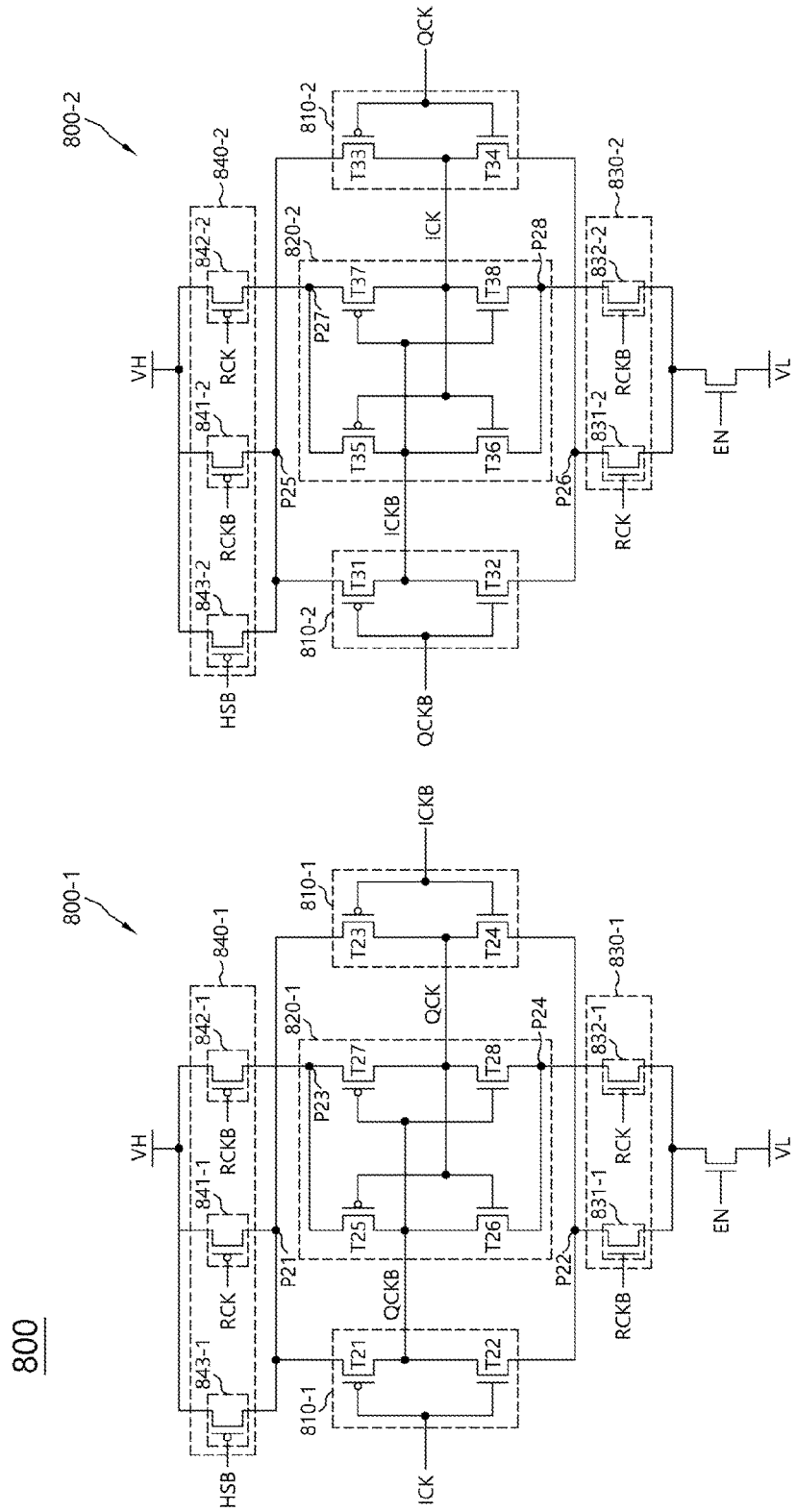
FIG. 8 is a diagram illustrating a representation of an example of the configuration of a frequency dividing circuit in accordance with an embodiment.

FIG. 8 is a diagram illustrating a representation of an example of the configuration of a frequency dividing circuit 800 in accordance with an embodiment. In FIG. 8, the frequency dividing circuit 800 may include a first amplification circuit 800-1 and a second amplification circuit 800-2. The first amplification circuit 800-1 and the second amplification circuit 800-2 may be substantially the same as the amplification circuit 700 shown in FIG. 7, and repeated descriptions may be omitted. The first amplification circuit 800-1 may include a first amplification stage 810-1 and a first latch stage 820-1. The first amplification stage 810-1 may include first to fourth transistors T21, T22, T23 and T24, and may generate third and fourth signals QCK and QCKB by differentially amplifying first and second signals ICK and ICKB. The first latch stage 820-1 may include fifth to eighth transistors T25, T26, T27 and T28, and may latch the third and fourth signals QCK and QCKB. The second amplification circuit 800-2 may have a configuration similar to the first amplification circuit 800-1 with only differences in the coupling relationships of input signals, output signals and reference clock signals. The second amplification circuit 800-2 may include a second amplification stage 810-2 and a second latch stage 820-2. The second amplification stage 810-2 may receive the third and fourth signals QCK and QCKB, and may output the first and second signals ICK and ICKB.

The second amplification stage 810-2 may include a first transistor T31, a second transistor T32, a third transistor T33 and a fourth transistor T34. The first and third transistors T31 and T33 may be P-channel MOS transistors, and the second and fourth transistors T32 and T34 may be N-channel MOS transistors. The first transistor T31 may have a gate which receives the fourth signal QCKB and a source which is coupled with a fifth power node P25. The second transistor T32 may have a gate which receives the fourth signal QCKB, a drain which is coupled with the drain of the first transistor T31 and a source which is coupled with a sixth power node P26. The second signal ICKB may be outputted from the drains of the first and second transistors T31 and T32. The third transistor T33 may have a gate which receives the third signal QCK and a source which is coupled with the fifth power node P25. The fourth transistor T34 may have a gate which receives the third signal QCK, a drain which is coupled with the drain of the third transistor T33 and a source which is coupled with the sixth power node P26. The first signal ICK may be outputted from the drains of the third and fourth transistors T33 and T34.

The second latch stage 820-2 may include a fifth transistor T35, a sixth transistor T36, a seventh transistor T37 and an eighth transistor T38. The fifth and seventh transistors T35 and T37 may be P-channel MOS transistors, and the sixth and eighth transistors T36 and T38 may be N-channel MOS transistors. The fifth transistor T35 may have a gate which is coupled with the drains of the third and fourth transistors T33 and T34 and receives the first signal ICK. The fifth transistor T35 may have a source which is coupled with a seventh power node P27. The sixth transistor T36 may have a gate which receives the first signal ICK, a drain which is coupled in common with the drains of the first transistor T31, the second transistor T32 and the fifth transistor T35 and a source which is coupled with an eighth power node P28. The seventh transistor T37 may have a gate which is coupled with the drains of the first and second transistors T31 and T32 and receives the second signal ICKB. The seventh transistor T37 may have a source which is coupled with the seventh power node P27. The eighth transistor T38 may have a gate which receives the second signal ICKB, a drain which is coupled in common with the drains of the third transistor T33, the fourth transistor T34 and the seventh transistor T37 and a source which is coupled with the eighth power node P28.

The frequency dividing circuit 800 may include a low voltage supply circuit 830-1 and 830-2 and a high voltage supply circuit 840-1 and 840-2. The low voltage supply circuit 830-1 and 830-2 may supply a low voltage VL to the first amplification stage 810-1 and the second latch stage 820-2 in a first operation period. The low voltage supply circuit 830-1 and 830-2 may supply the low voltage VL to the first latch stage 820-1 and the second amplification stage 810-2 in a second operation period. When a semiconductor apparatus operates at a low frequency, the high voltage supply circuit 840-1 and 840-2 may supply a high voltage VH to the first amplification stage 810-1 and the second latch stage 820-2 in the first operation period, and may supply the high voltage VH to the first latch stage 820-1 and the second amplification stage 810-2 in the second operation period. When the semiconductor apparatus operates at a high frequency, the high voltage supply circuit 840-1 and 840-2 may supply the high voltage VH to the first amplification stage 810-1 and the second amplification stage 810-2 in both the first and second operation periods.

The low voltage supply circuit 830-1 and 830-2 may include a first low voltage supplier 830-1 and a second low voltage supplier 830-2. The first low voltage supplier 830-1 may supply the low voltage VL to one of the first amplification stage 810-1 and the first latch stage 820-1 based on a reference clock signal RCK. The first low voltage supplier 830-1 may include a first low voltage switch 831-1 and a second low voltage switch 832-1. The first low voltage switch 831-1 may supply the low voltage VL to a second power node P22 in the first level period of the reference clock signal RCK. The second low voltage switch 832-1 may supply the low voltage VL to a fourth power node P24 in the second level period of the reference clock signal RCK. The first low voltage supplier 830-1 may be a component of the first amplification circuit 800-1. The second low voltage supplier 830-2 may supply the low voltage VL to one of the second amplification stage 810-2 and the second latch stage 820-2 based on the reference clock signal RCK. The second low voltage supplier 830-2 may include a third low voltage switch 831-2 and a fourth low voltage switch 832-2. The third low voltage switch 831-2 may supply the low voltage VL to the sixth power node P26 in the second level period of the reference clock signal RCK. The fourth low voltage switch 832-2 may supply the low voltage VL to the eighth power node P28 in the first level period of the reference clock signal RCK. The second low voltage supplier 830-2 may be a component of the second amplification circuit 800-2.

The high voltage supply circuit 840-1 and 840-2 may include a first high voltage supplier 840-1 and a second high voltage supplier 840-2. The first high voltage supplier 840-1 may supply the high voltage VH to one of the first amplification stage 810-1 and the first latch stage 820-1 based on the reference clock signal RCK. The first high voltage supplier 840-1 may supply the high voltage VH to the first amplification stage 810-1 based on a high speed operation signal HSB. The first high voltage supplier 840-1 may include a first high voltage switch 841-1, a second high voltage switch 842-1 and a third high voltage switch 843-1. The first high voltage switch 841-1 may supply the high voltage VH to a first power node P21 in the first level period of the reference clock signal RCK. The second high voltage switch 842-1 may supply the high voltage VH to a third power node P23 in the second level period of the reference clock signal RCK. The third high voltage switch 843-1 may supply the high voltage VH to the first power node P21 regardless of the reference clock signal RCK when the high speed operation signal HSB is enabled. The first high voltage supplier 840-1 may be a component of the first amplification circuit 800-1.

The second high voltage supplier 840-2 may supply the high voltage VH to one of the second amplification stage 810-2 and the second latch stage 820-2 based on the reference clock signal RCK. The second high voltage supplier 840-2 may supply the high voltage VH to the second amplification stage 810-2 based on the high speed operation signal HSB. The second high voltage supplier 840-2 may include a fourth high voltage switch 841-2, a fifth high voltage switch 842-2 and a sixth high voltage switch 843-2. The fourth high voltage switch 841-2 may supply the high voltage VH to the fifth power node P25 in the second level period of the reference clock signal RCK. The fifth high voltage switch 842-2 may supply the high voltage VH to the seventh power node P27 in the first level period of the reference clock signal RCK. The sixth high voltage switch 843-2 may supply the high voltage VH to the fifth power node P25 regardless of the reference clock signal RCK when the high speed operation signal HSB is enabled. The second high voltage supplier 840-2 may be a component of the second amplification circuit 800-2.

Figure 9:
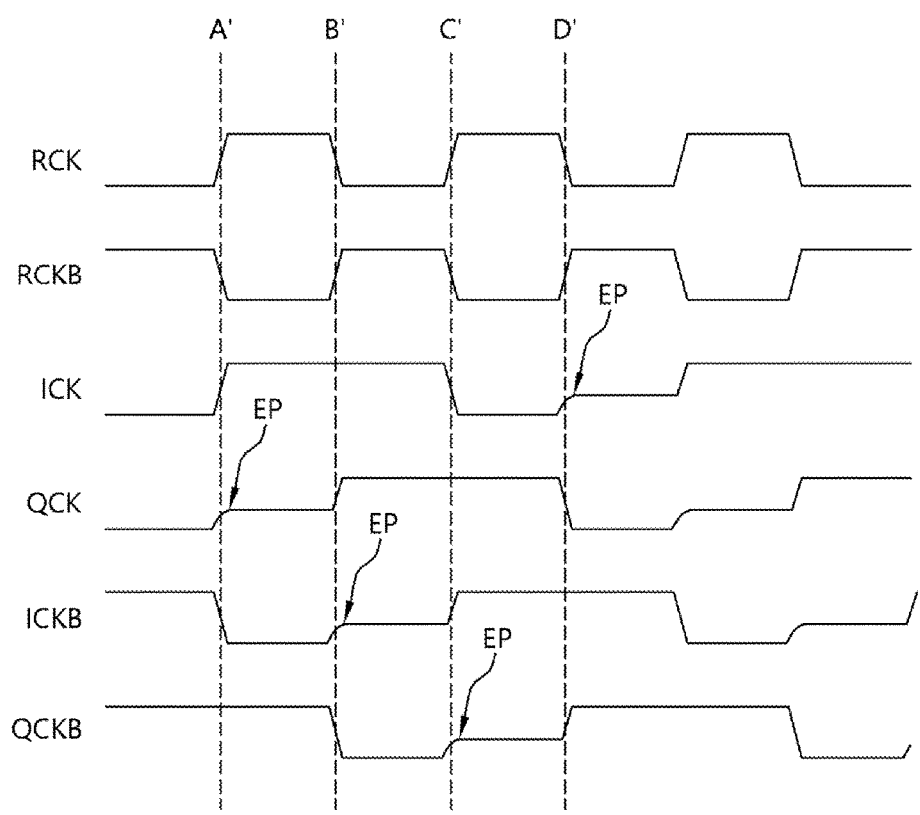
FIG. 9 is a representation of an example of a timing diagram to assist in the explanation of the operation of the frequency dividing circuit in accordance with an embodiment.

FIG. 9 is a representation of an example of a timing diagram to assist in the explanation of the operation of the frequency dividing circuit 800 in accordance with an embodiment. The operation of the frequency dividing circuit 800 in accordance with an embodiment will be described below with reference to FIGS. 8 and 9. The frequency dividing circuit 800 may operate in the same manner as shown in FIG. 6 when the semiconductor apparatus operates at a low frequency. Thus, the operation of the frequency dividing circuit 800 when the semiconductor apparatus operates at a high frequency will be described below. When the semiconductor apparatus operates at a high frequency, the high speed operation signal HSB may be enabled, and the first high voltage supplier 840-1 and the second high voltage supplier 840-2 may supply the high voltage VH to the first and second amplification stages 810-1 and 810-2, respectively, regardless of the reference clock signal RCK. For example, the initial states of the first and third signals ICK and QCK may be low levels, and the initial states of the second and fourth signals ICKB and QCKB may be high levels. If the reference clock signal RCK becomes a high level (A'), a complementary reference clock signal RCKB may become a low level. When the reference clock signal RCK is the high level (A'), the second low voltage switch 832-1 and the second high voltage switch 842-1 may be turned on, and the high voltage VH and the low voltage VL may be supplied to the first latch stage 820-1. The third low voltage switch 831-2 and the fourth high voltage switch 841-2 may be turned on, and the high voltage VH and the low voltage VL may be supplied to the second amplification stage 810-2. Since the fourth signal QCKB is the high level and the third signal QCK is the low level, the fifth transistor T25 and the eighth transistor T28 may be turned on. The first latch stage 820-1 may hold the third signal QCK at the low level and hold the fourth signal QCKB at the high level. Since the second amplification stage 810-2 receives the third signal QCK which has the low level and the fourth signal QCKB which has the high level, the second transistor T32 and the third transistor T33 may be turned on, and the second signal ICKB which has a low level and the first signal ICK which has a high level may be generated. At this time, the first amplification stage 810-1 is supplied with the high voltage VH through the third high voltage switch 843-1, and, since the second signal ICKB is the low level, the third transistor T23 may be turned on. Therefore, current may flow through the third transistor T23 and the eighth transistor T28, and the voltage level of the third signal QCK may be slightly raised as indicated by the reference symbol EP. As the first amplification stage 810-1 slightly raises the voltage level of the third signal QCK which has the low level, it is possible to facilitate the third signal QCK to subsequently transition to a high level. Namely, the first amplification stage 810-1 may perform an emphasis operation for the third signal QCK.

If the reference clock signal RCK becomes a low level (B'), the complementary reference clock signal RCKB may become a high level. When the reference clock signal RCK is the low level (B'), the first low voltage switch 831-1 and the first high voltage switch 841-1 may be turned on, and the high voltage VH and the low voltage VL may be supplied to the first amplification stage 810-1. The fourth low voltage switch 832-2 and the fifth high voltage switch 842-2 may be turned on, and the high voltage VH and the low voltage VL may be supplied to the second latch stage 820-2. Since the first amplification stage 810-1 receives the first signal ICK which has the high level and the second signal ICKB which has the low level, the second transistor T22 and the third transistor T23 may be turned on, and the fourth signal QCKB which has a low level and the third signal QCK which has a high level may be generated. Since the third signal QCK is in the state in which the voltage level thereof is slightly raised by the emphasis operation, the third signal QCK may easily transition to the high level. Since the first signal ICK is the high level and the second signal ICKB is the low level, the sixth transistor T36 and the seventh transistor T37 may be turned on. The second latch stage 820-2 may hold the first signal ICK at the high level and hold the second signal ICKB at the low level. At this time, the second amplification stage 810-2 is supplied with the high voltage VH through the sixth high voltage switch 843-2, and, since the fourth signal QCKB is the low level, the first transistor T31 may be turned on. Therefore, current may flow through the first transistor T31 and the sixth transistor T36, and the voltage level of the second signal ICKB may be slightly raised as indicated by the reference symbol EP. As the second amplification stage 810-2 slightly raises the voltage level of the second signal ICKB which has the low level, it is possible to facilitate the second signal ICKB to subsequently transition to the high level. Namely, the second amplification stage 810-2 may perform an emphasis operation for the second signal ICKB.

When the reference clock signal RCK becomes the high level again (C'), the complementary reference clock signal RCKB may become the low level. When the reference clock signal RCK is the high level (C'), the second low voltage switch 832-1 and the second high voltage switch 834-1 may be turned on, and the high voltage VH and the low voltage VL may be supplied to the first latch stage 820-1. The third low voltage switch 831-2 and the fourth high voltage switch 841-2 may be turned on, and the high voltage VH and the low voltage VL may be supplied to the second amplification stage 810-2. Since the third signal QCK is the high level and the fourth signal QCKB is the low level, the sixth transistor T26 and the seventh transistor T27 may be turned on. The first latch stage 820-1 may hold the third signal QCK at the high level and hold the fourth signal QCKB at the low level. Since the second amplification stage 810-2 receives the third signal QCK which has the high level and the fourth signal QCKB which has the low level, the first transistor T31 and the fourth transistor T34 may be turned on, and the second signal ICKB which has the high level and the first signal ICK which has the low level may be generated. Since the second signal ICKB is in the state in which the voltage level thereof is slightly raised by the emphasis operation, the second signal ICKB may easily transition to the high level. At this time, the first amplification stage 810-1 is supplied with the high voltage VH through the third high voltage switch 843-1, and, since the first signal ICK is the low level, the first transistor T21 may be turned on. Therefore, current may flow through the first transistor T21 and the sixth transistor T26, and the voltage level of the fourth signal QCKB may be slightly raised as indicated by the reference symbol EP. As the first amplification stage 810-1 slightly raises the voltage level of the fourth signal QCKB which has the low level, it is possible to facilitate the fourth signal QCKB to subsequently transition to the high level. Namely, the first amplification stage 810-1 may perform an emphasis operation for the fourth signal QCKB.

When the reference clock signal RCK becomes the low level again (D'), the complementary reference clock signal RCKB may become the high level. When the reference clock signal RCK is the low level (D'), the first low voltage switch 831-1 and the first high voltage switch 841-1 may be turned on, and the high voltage VH and the low voltage VL may be supplied to the first amplification stage 810-1. The fourth low voltage switch 832-2 and the fifth high voltage switch 842-2 may be turned on, and the high voltage VH and the low voltage VL may be supplied to the second latch stage 820-2. Since the first amplification stage 810-1 receives the first signal ICK which has the low level and the second signal ICKB which has the high level, the first transistor T21 and the fourth transistor T24 may be turned on, and the fourth signal QCKB which has the high level and the third signal QCK which has the low level may be generated. Since the fourth signal QCKB is in the state in which the voltage level thereof is slightly raised by the emphasis operation, the fourth signal QCKB may easily transition to the high level. Since the first signal ICK is the low level and the second signal ICKB is the high level, the fifth transistor T35 and the eighth transistor T38 may be turned on. The second latch stage 820-2 may hold the first signal ICK at the low level and hold the second signal ICKB at the high level. At this time, the second amplification stage 810-2 is supplied with the high voltage VH through the sixth high voltage switch 843-2, and, since the third signal QCK is the low level, the third transistor T33 may be turned on. Therefore, current may flow through the third transistor T33 and the eighth transistor T38, and the voltage level of the first signal ICK may be slightly raised as indicated by the reference symbol EP. As the second amplification stage 810-2 slightly raises the voltage level of the first signal ICK which has the low level, it is possible to facilitate the first signal ICK to subsequently transition to the high level. Namely, the second amplification stage 810-2 may perform an emphasis operation for the first signal ICK.

While various embodiments have been described above, it will be understood to those skilled in the art that the embodiments described are examples only. Accordingly, the amplification circuit, and the frequency dividing circuit, the semiconductor apparatus and the semiconductor system using the same described herein should not be limited based on the described embodiments.

What is claimed is:

1. An amplification circuit comprising:
   an amplification stage configured to amplify a first signal and a second signal, and generate third and fourth signals;
   a latch stage configured to latch the third and fourth signals;
   a low voltage supplier configured to couple a first voltage to the amplification stage and the latch stage based on a reference clock signal; and
   a high voltage supplier configured to couple a second voltage higher than the first voltage to the amplification stage and the latch stage based on the reference clock signal,
   wherein the low voltage supplier includes a first low voltage switch configured to couple the first voltage to the latch stage based on the reference clock signal.

2. The amplification circuit according to claim 1,
   wherein the low voltage supplier couples the first voltage to one of the amplification stage and the latch stage depending on a level of the reference clock signal, and
   wherein the low voltage supplier comprises:
   a second low voltage switch configured to couple the first voltage to the amplification stage based on the reference clock signal.

3. The amplification circuit according to claim 1,
   wherein the high voltage supplier couples the second voltage to one of the amplification stage and the latch stage depending on a level of the reference clock signal, and
   wherein the high voltage supplier comprises:
   a first high voltage switch configured to couple the second voltage to the amplification stage based on the reference clock signal; and
   a second high voltage switch configured to couple the second voltage to the latch stage based on the reference clock signal.

4. The amplification circuit according to claim 1, wherein the high voltage supplier further receives a high speed operation signal, and couples the second voltage to the amplification stage regardless of a level of the reference clock signal based on the high speed operation signal.

5. The amplification circuit according to claim 4, wherein the high voltage supplier comprises:
   a first high voltage switch configured to couple the second voltage to the amplification stage based on the reference clock signal;
   a second high voltage switch configured to couple the second voltage to the latch stage based on the reference clock signal; and
   a third high voltage switch configured to couple the second voltage to the amplification stage based on the high speed operation signal.

6. A frequency dividing circuit comprising:
   a first amplification circuit including a first amplification stage which differentially amplifies a first signal and a second signal and generates a third signal and a fourth signal in a first operation period, and a first latch stage which latches the third signal and the fourth signal in a second operation period; and
   a second amplification circuit including a second amplification stage which differentially amplifies the third signal and the fourth signal and generates the first signal and the second signal in the second operation period, and a second latch stage which latches the first signal and the second signal in the first operation period,
   wherein the first amplification circuit couples a first voltage to the first amplification stage in the first operation period and the second amplification circuit couples the first voltage to the second latch stage in the first operation period,
   wherein the first amplification circuit couples the first voltage to the first latch stage in the second operation period and the second amplification circuit couples the first voltage to the second amplification stage in the second operation period,
   wherein the first amplification circuit couples a second voltage higher than the first voltage to the first amplification stage in the first operation period and the second amplification circuit couples the second voltage to the second latch stage in the first operation period, and
   wherein the first amplification circuit couples the second voltage to the first latch stage in the second operation period and the second amplification circuit couples the second voltage to the second amplification stage in the second operation period.

7. The frequency dividing circuit according to claim 6,
   wherein the first and second amplification circuits operate based on a reference clock signal, and
   wherein the first operation period is a first level period of the reference clock signal, and the second operation period is a second level period of the reference clock signal.

8. The frequency dividing circuit according to claim 7,
   wherein a frequency of the reference clock signal is greater than a frequency of the first signal, the second signal, the third signal, or the fourth signal.

9. The frequency dividing circuit according to claim 6,
   wherein the first amplification circuit comprises:
   a first low voltage supplier configured to couple the first voltage to one of the first amplification stage and the first latch stage based on the reference clock signal; and
   a first high voltage supplier configured to couple the second voltage to one of the first amplification stage and the first latch stage based on the reference clock signal.

10. The frequency dividing circuit according to claim 9, wherein the first low voltage supplier comprises:
    a first low voltage switch configured to couple the first voltage to the first amplification stage in the first level period of the reference clock signal; and
    a second low voltage switch configured to couple the first voltage to the first latch stage in the second level period of the reference clock signal.

11. The frequency dividing circuit according to claim 9, wherein the first high voltage supplier comprises:
    a first high voltage switch configured to couple the second voltage to the first amplification stage in the first level period of the reference clock signal; and a second high voltage switch configured to couple the second voltage to the first latch stage in the second level period of the reference clock signal.

12. The frequency dividing circuit according to claim 6, wherein the second amplification circuit comprises:
 a second low voltage supplier configured to couple the first voltage to one of the second amplification stage and the second latch stage based on the reference clock signal; and
 a second high voltage supplier configured to couple the second voltage to one of the second amplification stage and the second latch stage based on the reference clock signal.

13. The frequency dividing circuit according to claim 12, wherein the second low voltage supplier comprises:
 a third low voltage switch configured to couple the first voltage to the second latch stage in the first level period of the reference clock signal; and
 a fourth low voltage switch configured to couple the first voltage to the second amplification stage in the second level period of the reference clock signal.

14. The frequency dividing circuit according to claim 12, wherein the second high voltage supplier comprises:
 a third high voltage switch configured to couple the second voltage to the second latch stage in the first level period of the reference clock signal; and
 a fourth high voltage switch configured to couple the second voltage to the second amplification stage in the second level period of the reference clock signal.

15. A frequency dividing circuit comprising:
 a first amplification circuit including a first amplification stage which differentially amplifies a first signal and a second signal and generates a third signal and a fourth signal in a first operation period, and a first latch stage which latches the third signal and the fourth signal in a second operation period; and
 a second amplification circuit including a second amplification stage which differentially amplifies the third signal and the fourth signal and generates the first signal and the second signal in the second operation period, and a second latch stage which latches the first signal and the second signal in the first operation period,
 wherein the first amplification circuit couples a first voltage to the first amplification stage in the first operation period and the second amplification circuit couples the first voltage to the second latch stage in the first operation period,
 wherein the first amplification circuit couples the first voltage to the first latch stage in the second operation period and the second amplification circuit couples the first voltage to the second amplification stage in the second operation period,
 wherein the first amplification circuit couples a second voltage higher than the first voltage to the first amplification stage in the first operation period, and the second amplification circuit couples the second voltage to the second latch stage in the first operation period,
 wherein the first amplification circuit couples the second voltage to the first latch stage in the second operation period and the second amplification circuit couples the second voltage to the second amplification stage in the second operation period, and
 wherein the first amplification circuit couples the second voltage to the first amplification stage in a high speed operation mode and the second amplification circuit couples the second voltage to the second amplification stage in the high speed operation mode.

16. The frequency dividing circuit according to claim 15, wherein the first and second amplification circuits respectively operate based on a reference clock signal, and
 wherein the first operation period is a first level period of the reference clock signal, and the second operation period is a second level period of the reference clock signal.

17. The frequency dividing circuit according to claim 15, wherein the first amplification circuit comprises:
 a first low voltage supplier configured to couple the first voltage to one of the first amplification stage and the first latch stage based on the reference clock signal; and
 a first high voltage supplier configured to couple the second voltage to one of the first amplification stage and the first latch stage based on the reference clock signal, and couple the second voltage to the first amplification stage regardless of a level of the reference clock signal based on a high speed operation signal.

18. The frequency dividing circuit according to claim 17, wherein the first low voltage supplier comprises:
 a first low voltage switch configured to couple the first voltage to the first amplification stage in the first level period of the reference clock signal; and
 a second low voltage switch configured to couple the first voltage to the first latch stage in the second level period of the reference clock signal.

19. The frequency dividing circuit according to claim 17, wherein the first high voltage supplier comprises:
 a first high voltage switch configured to couple the second voltage to the first amplification stage in the first level period of the reference clock signal;
 a second high voltage switch configured to couple the second voltage to the first latch stage in the second level period of the reference clock signal; and
 a third high voltage switch configured to couple the second voltage to the first amplification stage based on the high speed operation signal.

20. The frequency dividing circuit according to claim 15, wherein the second amplification circuit comprises:
 a second low voltage supplier configured to couple the first voltage to one of the second amplification stage and the second latch stage based on the reference clock signal; and
 a second high voltage supplier configured to couple the second voltage to one of the second amplification stage and the second latch stage based on the reference clock signal, and couple the second voltage to the second amplification stage regardless of a level of the reference clock signal based on the high speed operation signal.

21. The frequency dividing circuit according to claim 20, wherein the second low voltage supplier comprises:
 a third low voltage switch configured to couple the first voltage to the second latch stage in the first level period of the reference clock signal; and
 a fourth low voltage switch configured to couple the first voltage to the second amplification stage in the second level period of the reference clock signal.

22. The frequency dividing circuit according to claim 20, wherein the second high voltage supplier comprises:
 a fourth high voltage switch configured to couple the second voltage to the second latch stage in the first level period of the reference clock signal;
 a fifth high voltage switch configured to couple the second voltage to the second amplification stage in the second level period of the reference clock signal; and a sixth high voltage switch configured to couple the second voltage to the second amplification stage based on the high speed operation signal.

23. An amplification circuit comprising:

an amplification stage configured to amplify a first signal and a second signal, and generate third and fourth signals while in a first operation period; and a latch stage configured to latch the third and fourth signals while in a in a second operation period, wherein a low voltage supplier couples a first voltage to the amplification stage during the first operation period and couples the first voltage to the latch stage during the second operation period, and wherein a high voltage supplier couples a second voltage higher than the first voltage to the amplification stage during the first operation period and couples the second voltage to the latch stage during the second operation period.

24. The amplification circuit according to claim 23, wherein the high voltage supplier comprises:

a first high voltage switch configured to couple the second voltage to the amplification stage based on the reference clock signal;

a second high voltage switch configured to couple the second voltage to the latch stage based on the reference clock signal; and a third high voltage switch configured to couple the second voltage to the amplification stage based on the high speed operation signal.

25. The amplification circuit according to claim 23, wherein the high voltage supplier couples the second voltage to the amplification stage regardless of the first and second operation periods in a high speed operation mode.

* * * * *